US 6,664,650 B2

(12) United States Patent
Chung et al.

(10) Patent No.: US 6,664,650 B2
(45) Date of Patent: Dec. 16, 2003

(54) METHOD OF FORMING AN ALIGNMENT KEY ON A SEMICONDUCTOR WAFER

(75) Inventors: Dong-Hoon Chung, Kyunggi-do (KR); Jae-Hwan Kim, Seoul (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/790,587

(22) Filed: Feb. 23, 2001

(65) Prior Publication Data

US 2001/0009294 A1 Jul. 26, 2001

Related U.S. Application Data

(62) Division of application No. 09/306,710, filed on May 7, 1999, now Pat. No. 6,218,263.

(30) Foreign Application Priority Data

May 7, 1998 (KR) ............................................. 98-16336

(51) Int. Cl.$^7$ ........................................... H01L 23/544
(52) U.S. Cl. ...................... 257/797; 257/620; 257/618; 438/462; 438/401; 361/741; 361/802
(58) Field of Search ................................ 257/797, 620; 438/401, 462, 975, FOR 435; 361/802, 741

(56) References Cited

U.S. PATENT DOCUMENTS

| | | | | |
|---|---|---|---|---|
| 4,123,661 A | * | 10/1978 | Wolf et al. | 250/492.1 |
| 5,051,807 A | * | 9/1991 | Morozumi | 357/40 |
| 5,475,268 A | * | 12/1995 | Kawagoe et al. | 257/758 |
| 5,760,484 A | * | 6/1998 | Lee et al. | 257/797 |
| 5,766,809 A | * | 6/1998 | Bae | 430/22 |
| 5,872,046 A | * | 2/1999 | Kaeriyama et al. | 438/465 |
| 5,910,679 A | * | 6/1999 | Kim | 257/622 |
| 5,933,744 A | * | 8/1999 | Chen et al. | 438/401 |
| 5,949,145 A | * | 9/1999 | Komuro | 257/797 |
| 5,963,816 A | * | 10/1999 | Wang et al. | 438/401 |
| 6,184,104 B1 | * | 2/2001 | Tan et al. | 438/401 |
| 6,228,743 B1 | * | 5/2001 | Chen et al. | 257/797 |
| 6,274,940 B1 | * | 8/2001 | Baker et al. | 257/797 |
| 6,344,697 B2 | * | 2/2002 | Sugiyama | 257/797 |
| 2001/0012593 A1 | * | 8/2001 | Chang et al. | 430/22 |

FOREIGN PATENT DOCUMENTS

| | | | |
|---|---|---|---|
| JP | 02-194530 | * | 8/1990 |
| JP | 3-206607 | * | 9/1991 |
| JP | 06-196534 | * | 7/1994 |
| JP | 59-182541 | * | 10/1994 |

* cited by examiner

*Primary Examiner*—David E. Graybill
*Assistant Examiner*—James Mitchell
(74) *Attorney, Agent, or Firm*—Lee & Sterba, P.C.

(57) ABSTRACT

A method for forming alignment keys on the scribe line areas of a semiconductor wafer. An etch blocking layer is used to reduce the depth of the channels forming the alignment key. One of the layers of material deposited on the semiconductor wafer to form integrated circuit devices on the wafer may be used as the etch blocking layer. A portion of this layer of material may be left intact on the scribe line areas during the manufacturing process. The subsequently deposited layers have an etch selectivity with respect to the etch blocking layer and the subsequently deposited layers are etched down to the etch blocking layer to form the alignment keys.

8 Claims, 6 Drawing Sheets

METHOD OF FORMING AN ALIGNMENT KEY ON A SEMICONDUCTOR WAFER

This application is a divisional application of application Ser. No. 09/306,710, filed May 7, 1999, now U.S. Pat. No. 6,218,263.

BACKGROUND OF THE INVENTION

1. Field of the Invention

The present invention relates to a method for manufacturing semiconductor devices and, more particularly, to a method of forming an alignment key on a semiconductor wafer.

2. Description of the Related Art

Semiconductor integrated circuit devices are made by forming a plurality of features in layers on a semiconductor wafer. The wafer is typically made from silicon or gallium arsenide, and photolithographic techniques are commonly used to form the features on the wafer. Each feature, when formed, must be aligned with the previously formed features in order for the integrated circuit to be properly constructed. To achieve this alignment, the usual practice is to provide alignment keys on the semiconductor wafer and corresponding alignment keys on each of the photolithographic masks used to form the features on the wafer. When the keys on the mask are aligned with the keys on the wafer, the features to be formed by the particular mask will be aligned with the features previously formed on the wafer.

FIG. 1 shows a semiconductor wafer 1 with integrated circuits formed on the wafer. The wafer 1 contains numerous die (or chip) areas 2 in which the integrated circuits are formed. The die areas 2 formed on the wafer 1 are separated from each other by vertical and horizontal scribe lines 3. As shown in FIG. 1, the horizontal scribe lines are evenly spaced and parallel to each other, the vertical scribe lines are evenly spaced and parallel to each other, and the horizontal and vertical scribe lines intersect at substantially right angles. After the wafer 1 has been processed to form the integrated circuits on each die area 2, the wafer 1 is cut into individual integrated circuit die by cutting along the scribe lines 3.

The conventional method of forming alignment keys on a semiconductor wafer will now be described with reference to FIG. 2. The alignment keys are formed on the scribe line areas at selected times during the fabrication process of the integrated circuit devices. As the fabrication process proceeds, the layer of material 13 formed on the surface of the semiconductor wafer substrate 10 increases in thickness. An alignment key 11 is formed by etching the layer 13 to produce channels in layer 13. After formation of the alignment key 11, a photoresist layer 12 is deposited over the entire surface of the semiconductor substrate 10. However, because of the thickness of the layer 13 and the resulting large depth of the channels forming the alignment key 11, the deposited photoresist layer 12 is often irregular and provides poor coverage of the channels, as shown in FIG. 2. This poor photoresist coverage of the alignment key 11 influences the die areas adjacent to the scribe line and may cause an undesireable "speed-boat" phenomenon.

This problem becomes more severe as more integrated circuit dies are packed more densely onto the wafer and the scribe lines are made narrower so that they occupy less area. This reduced width of the scribe lines also reduces the width of the channels forming the alignment keys and exacerbates the problem of poor photoresist coverage.

SUMMARY OF THE INVENTION

The present invention is directed to overcoming or at least reducing the effects of the problems set forth above.

One feature of the invention is that the alignment keys are formed with channels having a reduced depth. Another feature of the invention is the use of a layer of material to block the etch of the alignment keys so the alignment key channels extend down only as for as that layer. This blocking layer is preferably formed by depositing a layer of material and etching the layer so that a portion of the layer remains on the scribe lines at the locations where the alignment keys will be formed. The blocking layer is preferably the layer which deposited in the step just preceding the formation of the alignment keys. The blocking layer preferably has etch selectivity with respect to the material in which the alignment keys are etched. Preferably, the blocking layer is any conductive layer composing the integrated circuit devices and the alignment key is etched into an insulating layer.

In accordance with one aspect of the invention there is provided a method for forming an alignment key on a semiconductor wafer having intersecting scribe line areas thereon to define a plurality of integrated circuit areas, the method comprising the steps of depositing a plurality of layers on the integrated circuit areas, depositing a predetermined one of the layers on one or more of the scribe line areas, and forming the alignment key on the predetermined layer. The step of forming the alignment key may comprise the steps of depositing an additional layer of material on the predetermined layer, and etching the additional layer down to the predetermined layer to form the alignment key.

In accordance with another aspect of the invention there is provided a semiconductor wafer comprising a plurality of scribe line areas defining a plurality of integrated circuit areas on the semiconductor wafer, a plurality of layers formed on the integrated circuit areas, a predetermined one of the layers formed on one of the scribe line areas, and an alignment key formed on one of the scribe line areas, the alignment key having channels extending down to the predetermined layer.

BRIEF DESCRIPTION OF THE DRAWINGS

The above features and advantages of the invention will become apparent upon reference to the following detailed description of specific embodiments and the attached drawings, of which.

DESCRIPTION OF SPECIFIC EMBODIMENTS

Korean application no. 98-16336, filed May 7, 1998, discloses the same subject matter as the present application and is hereby incorporated by reference as if fully set forth herein.

Figure 1:
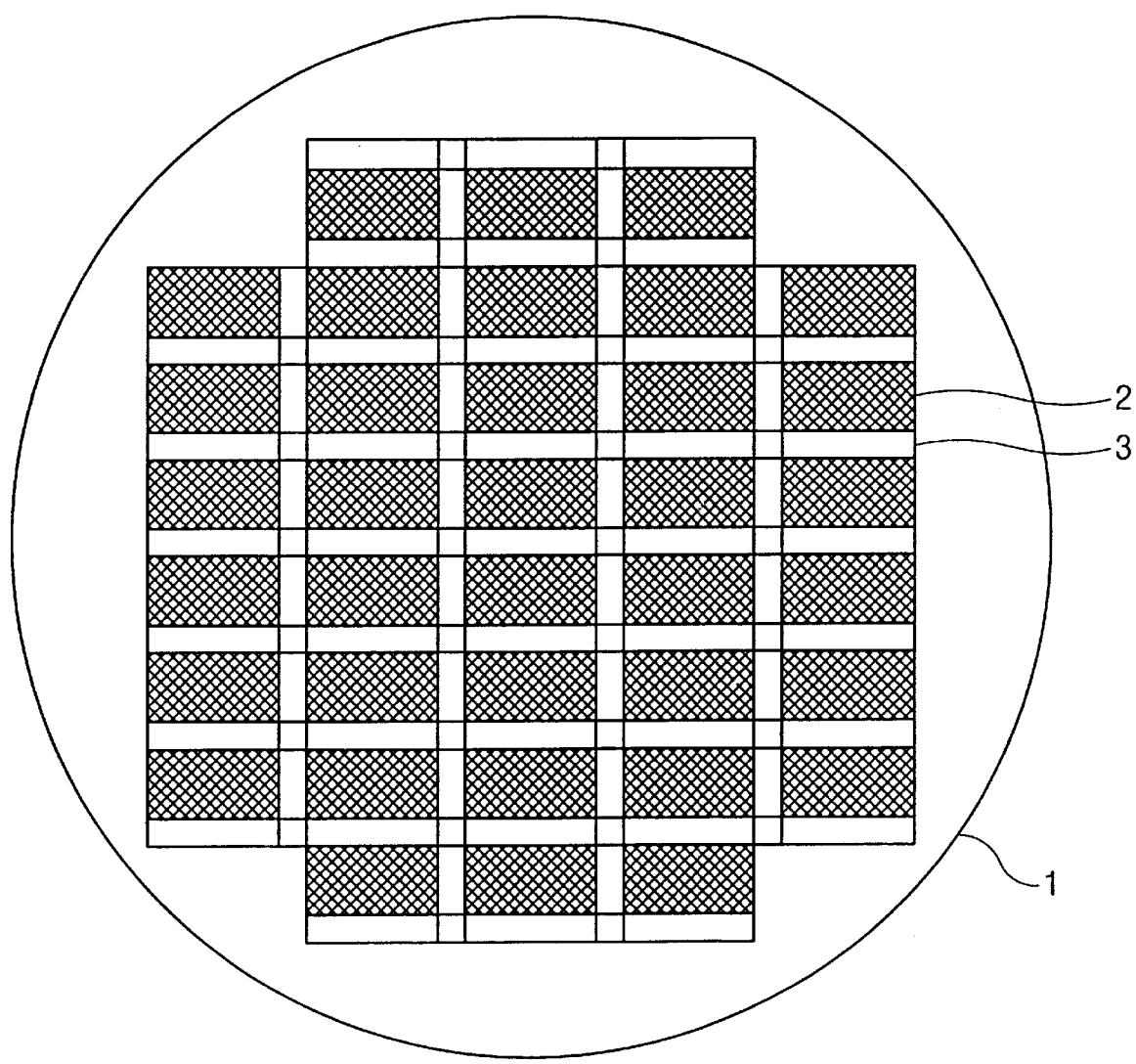
FIG. 1 is a plan view of a semiconductor wafer with a plurality of die areas formed on the wafer.
Figure 2:
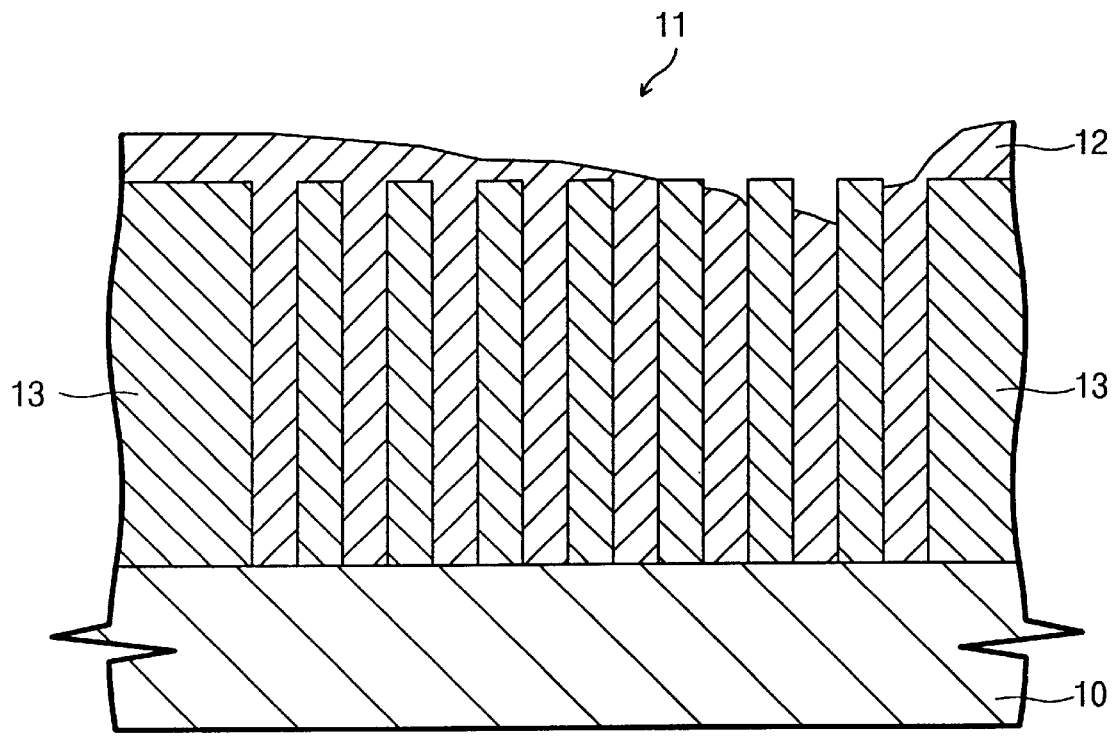
FIG. 2 is a cross-sectional view of a semiconductor wafer showing an alignment key explaining the speed boat phenomenon.
Figure 3A:
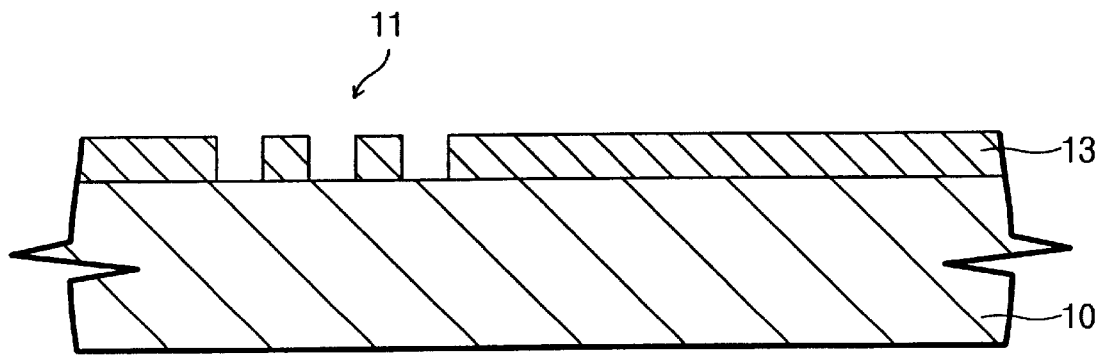
FIGS. 3–5 are cross-sectional views of a semiconductor wafer showing the formation of alignment keys at different times during the fabrication process in accordance with a first embodiment of the present invention.
Figure 3B:
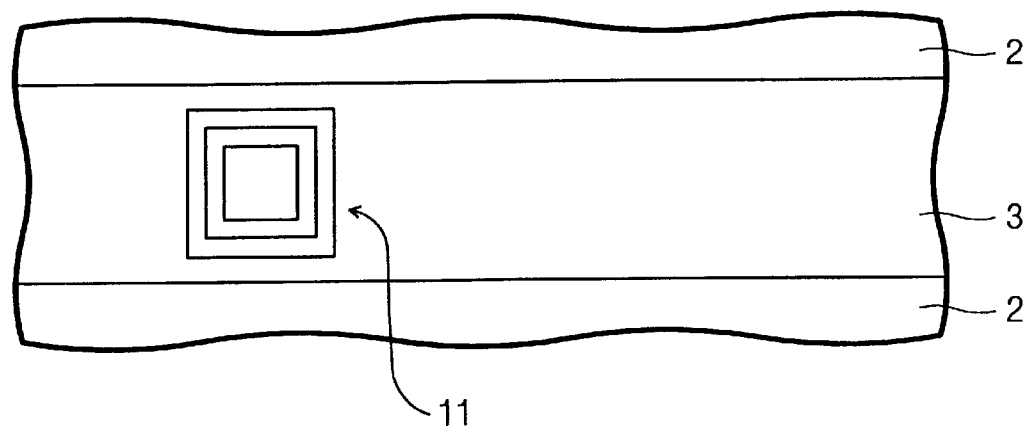

A first embodiment of the present invention will now be described with reference to the accompanying drawings. FIG. 3A shows a cross-sectional view of a semiconductor wafer with an alignment key formed thereon in accordance with a first embodiment of the present invention. Where the same part appears in previous drawings, the same reference numbers have been used for the part in FIG. 3. Referring to FIG. 3A, a layer 13 is shown in cross-section at the location of the scribe line where alignment key 11 is formed. The channels forming the alignment key 11 extend down to the semiconductor substrate 10. FIG. 3B shows a plan view of the semiconductor wafer with the alignment key 11 formed on the scribe line 3 between die areas 2.

Figure 4A:
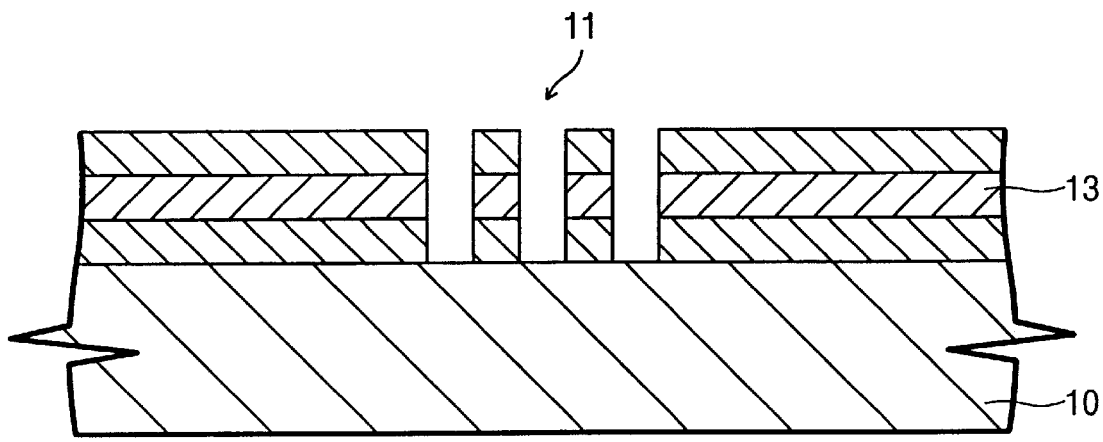
Figure 4B:
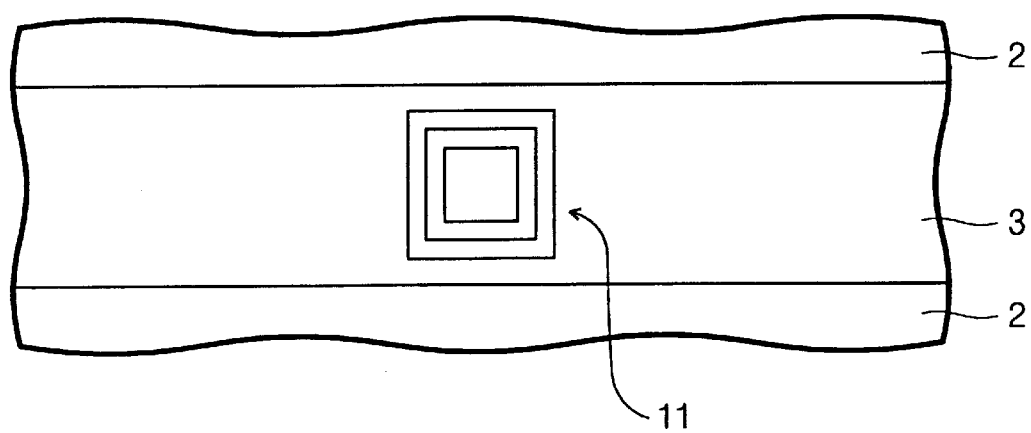

During the manufacturing process of the integrated circuit device being formed on the semiconductor wafer, alignment keys are formed at various times by etching layer 13 at the scribe line. As the manufacturing process proceeds, the thickness of layer 13 increases at the location where the etching of the alignment key 11 takes place. FIG. 4A shows a cross-sectional view of the semiconductor wafer with alignment key 11 formed thereon at a time subsequent to the formation of the alignment key shown in FIG. 3A. As shown in FIG. 4A, layer 13 now has a greater thickness due to additional layers being formed on the semiconductor substrate 10. The layer 13 at the location of the scribe line is generally made of a plurality of insulating and conducting layers composing the features of the integrated circuit devices being manufactured. The increase in the thickness of layer 13 increases the depth of the channels of the alignment key 11. As before, the channels forming the alignment key 11 extend down to the semiconductor substrate 10. FIG. 4B shows a plan view of the semiconductor wafer with the alignment key 11 formed on the scribe line 3 between die areas 2.

Figure 5A:
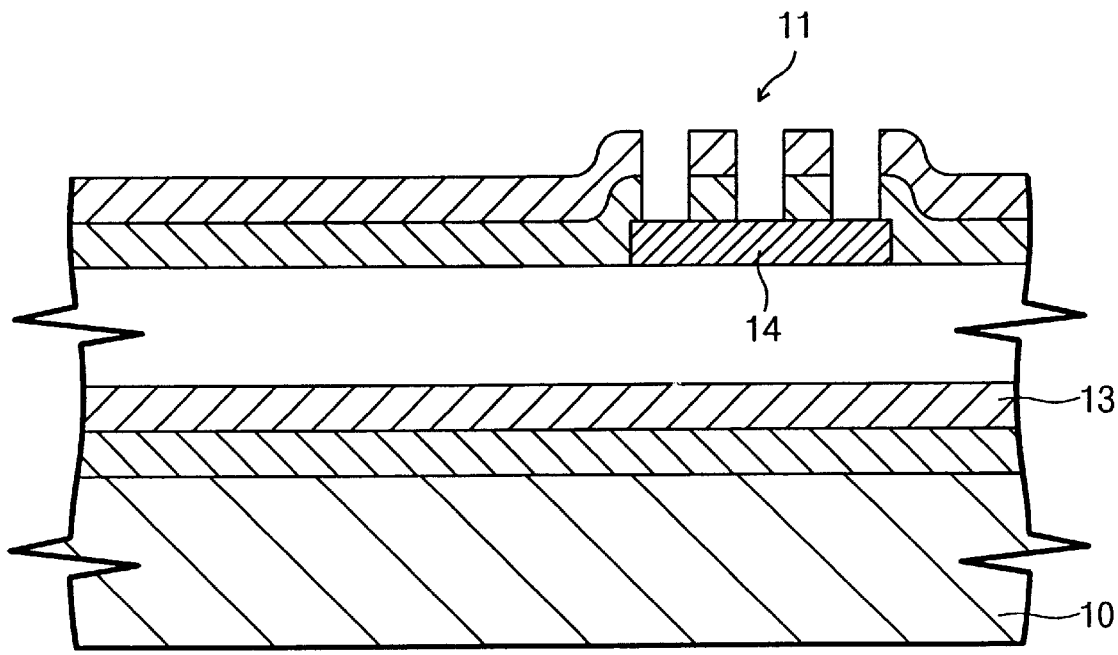
Figure 5B:
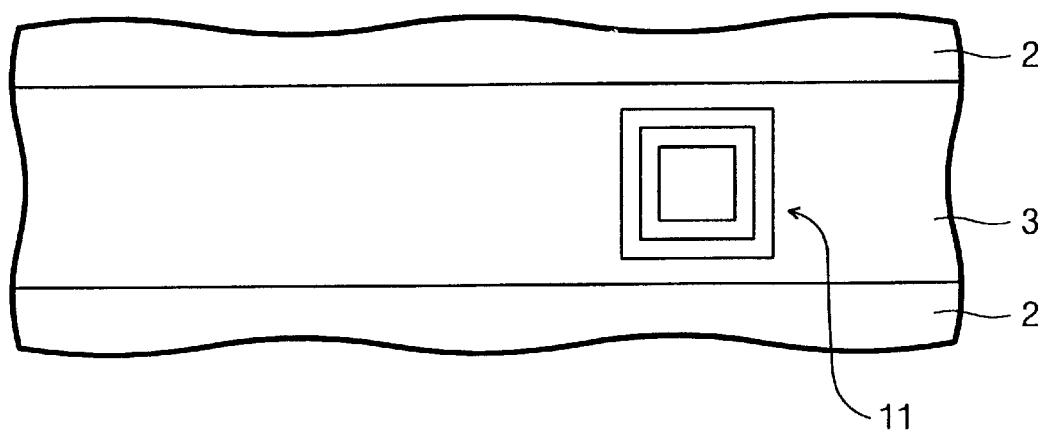

As the manufacturing process nears the end, the thickness of layer 13 increases the depth of the channels of the alignment key 11, resulting in a poor deposition profile of the subsequent photoresist layer, which eventually influences neighboring chip areas. FIG. 5A shows a cross-sectional view of the semiconductor wafer with an alignment key formed thereon at a time subsequent to the formation of the alignment key shown in FIG. 4A. FIG. 5B shows a plan view of the semiconductor wafer with the alignment key 11 formed on the scribe line 3 between die areas 2.

To improve the deposition profile of the photoresist layer, the conditions under which the deposition of the photoresist layer 12 is accomplished may be changed or the depth of the channels of the alignment key 11 may be reduced. However, any change in the deposition process of the photoresist layer may affect the resolution of the deposition process or may have other undesirable consequences. Therefore, it is desired to reduce the depth of the alignment key channels. Using the process herein, the depth of the alignment key channels may be reduced to 10,000 Å or less, although any reduction in depth is desireable.

To achieve this result, this embodiment of the invention uses a blocking or etching stop layer 14 to prevent the etching of layer 13 all the way down to the top surface of the semiconductor substrate 10. As shown in FIG. 5A, the blocking layer 14 is formed at the scribe line where the alignment key 11 will be formed. The material used for the blocking layer 14 is chosen to have an etch selectivity with respect to the materials composing the alignment key 11 (i.e. the materials of layer 13 into which the alignment key is etched), and the blocking layer material may be the same as one of the materials in layer 13. For example, polysilicon may be used for the blocking layer 14 and the blocking layer may be formed as follows:

After depositing a polysilicon layer to form certain features of the integrated circuit device being manufactured, the unwanted portions of the polysilicon layer are etched away. A portion of the polysilicon layer is left at the scribe line in the location where an alignment key will be formed. This remaining portion of the polysilicon layer serves as the blocking layer 14.

After forming the blocking layer 14, an insulating layer is preferably deposited on the scribe line. The deposited insulating layer is then etched down to the blocking layer 14 to form alignment key 11, as shown in FIG. 5A. The depth of the alignment key 11 can be determined by selecting the step during the manufacturing process in which the blocking layer 14 is applied.

Figure 6:
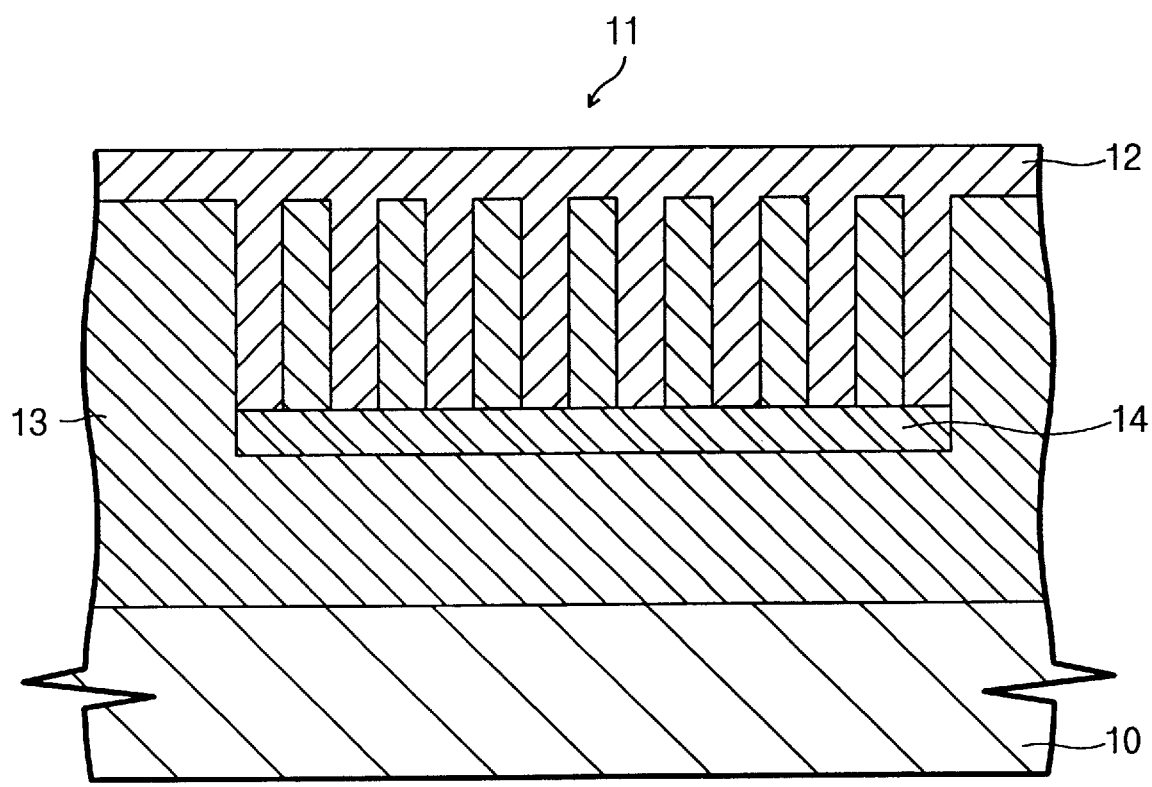
FIG. 6 is a cross-sectional view of a semiconductor wafer showing an alignment key in accordance with a second embodiment of the present invention.

FIG. 6 shows another type of alignment key different from that shown in FIGS. 3–5. Where the same part appears in previous drawings, the same reference numbers have been used for the part in FIG. 6. As can be seen FIG. 6, the blocking layer 14 is formed below the alignment key 11. The presence of the blocking layer 14 prevents layer 13 (which is patterned to form the alignment key 11) from being etched down to the top surface of the semiconductor substrate 10, thereby reducing the depth of channels of alignment key 11. If the blocking layer is not formed, the depth of the alignment key channels will be the same as the thickness of layer 13. After formation of the alignment key 11, a photoresist layer 12 is deposited onto the surface of layer 13 and the alignment key 11. Because of the reduced depth of the alignment key channels, the deposited photoresist layer 12 provides uniform coverage of the alignment key 11 and exhibits a good deposition profile as shown in FIG. 6.

It will be recognized by those skilled in the art that the innovative concepts disclosed in the present application can be applied in a wide variety of contexts. Moreover, the preferred implementation can be modified in a tremendous variety of ways. Accordingly, it should be understood that specific embodiments have been shown by way of example in the drawings and described in detail herein. However, it should be understood that the invention is not limited to the particular forms disclosed. Rather, the invention covers all modifications, equivalents, and alternatives falling within the spirit and scope of the invention as defined in the appended claims.

What is claimed is:

1. A semiconductor wafer comprising:
    a plurality of scribe line areas defining a plurality of integrated circuit areas on said semiconductor wafer;
    a plurality of layers formed on said integrated circuit areas;
    a predetermined one of said layers formed on one of said scribe line areas, wherein said predetermined layer is continuous and formed of a conductive material; and
    an alignment key having channels formed on one of said scribe line areas including said continuous, conductive predetermined layer, such that said channels and material in which said channels are formed extend down to said continuous, conductive predetermined layer that said continuous, conductive predetermined layer is underneath said channels and material in which said channels are formed.

2. The semiconductor wafer of claim 1, wherein said alignment key is formed by depositing an additional layer of material on said predetermined layer and etching said additional layer down to said predetermined layer to form said alignment key.

3. The semiconductor wafer of claim 2, wherein said additional layer of material has an etching selectivity with respect to said predetermined layer.

4. The semiconductor wafer as claimed in claim 3, wherein said additional layer comprises an insulating material.

5. The semiconductor wafer as claimed in claim 1, further comprising a photoresist layer deposited on said plurality of layers and said alignment key.

6. The semiconductor wafer of claim 5, wherein said alignment key is formed by depositing an additional layer of material on said predetermined layer and etching said additional layer down to said predetermined layer to form said alignment key.

7. The semiconductor wafer of claim 6, wherein said additional layer of material has an etching selectivity with respect to said predetermined layer.

8. The semiconductor wafer of claim 7, wherein said additional layer comprises an insulating material.

* * * * *